(12) United States Patent
Koo et al.

(10) Patent No.: US 12,451,358 B2
(45) Date of Patent: Oct. 21, 2025

(54) METHOD FOR FABRICATING SEMICONDUCTOR DEVICE AND APPARATUS FOR PROCESSING SUBSTRATE USING PLASMA

(71) Applicant: SEMES Co., Ltd., Chungcheongnam-do (KR)

(72) Inventors: Joun Taek Koo, Seoul (KR); Seong Gil Lee, Gyeonggi-do (KR); Wan Jae Park, Gyeonggi-do (KR); Young Je Um, Busan (KR); Dong Hun Kim, Seoul (KR); Ji Hwan Lee, Incheon (KR); Dong Sub Oh, Busan (KR); Myoung Sub Noh, Gyeonggi-do (KR); Du Ri Kim, Incheon (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 460 days.

(21) Appl. No.: 17/393,601

(22) Filed: Aug. 4, 2021

(65) Prior Publication Data
US 2022/0084829 A1 Mar. 17, 2022

(30) Foreign Application Priority Data
Sep. 11, 2020 (KR) .................. 10-2020-0116548

(51) Int. Cl.
*H01L 21/28* (2025.01)
*H01L 21/3065* (2006.01)
(Continued)

(52) U.S. Cl.
CPC .... *H01L 21/28008* (2013.01); *H01L 21/3065* (2013.01); *H01L 21/67069* (2013.01); *H10B 41/27* (2023.02); *H10B 43/27* (2023.02)

(58) Field of Classification Search
CPC .......... H01L 21/28008; H01L 21/3065; H01L 21/67069; H01L 21/31116;
(Continued)

(56) References Cited

U.S. PATENT DOCUMENTS

| | | | | |
|---|---|---|---|---|
| 8,076,198 B2* | 12/2011 | Lee | ......... | H10B 41/27 |
| | | | | 438/257 |
| 8,643,084 B2* | 2/2014 | Shin | ......... | H10D 30/694 |
| | | | | 257/317 |

(Continued)

FOREIGN PATENT DOCUMENTS

| | | |
|---|---|---|
| CN | 103050396 A | 4/2013 |
| KR | 20100078776 A | 7/2010 |

(Continued)

OTHER PUBLICATIONS

Korean Written Decision on Registration for Korean Application No. 10-2020-0116548, dated Sep. 27, 2023 with translation, 10 pages.

(Continued)

*Primary Examiner* — Jay C Kim
(74) *Attorney, Agent, or Firm* — Buchanan Ingersoll & Rooney PC (57) ABSTRACT

A method of fabricating a semiconductor device with improved electrical characteristics and reliability is provided. The method of fabricating the semiconductor device includes providing a substrate, in which a first oxide film, a nitride film, and a second oxide film are sequentially stacked, and a trench penetrating the first oxide film, the nitride film, and the second oxide film is formed, chamfering the oxide film exposed by the trench while removing a part of the nitride film exposed by the trench by using a first plasma process, and removing the nitride film left after the first plasma process by using a second plasma process.

5 Claims, 11 Drawing Sheets

(51) Int. Cl.
*H01L 21/67* (2006.01)
*H10B 41/27* (2023.01)
*H10B 43/27* (2023.01)

(58) Field of Classification Search
CPC .......... H01L 21/02164; H01L 21/0217; H10B 41/27; H10B 43/27; H10B 41/35; H10B 43/35; H01J 37/32357; H01J 37/32422; H01J 37/32348; H01J 37/3244; H10D 30/0411; H10D 30/0413; H10D 30/6891; H10D 30/694
See application file for complete search history.

(56) References Cited

U.S. PATENT DOCUMENTS

| | | | | |
|---|---|---|---|---|
| 8,912,591 B2* | 12/2014 | Baek | ............ | H10B 43/30 |
| | | | | 257/E27.103 |
| 9,356,031 B2* | 5/2016 | Lee | ............ | H01L 21/764 |
| 9,553,146 B2* | 1/2017 | Zhang | ............ | H10B 43/35 |
| 9,653,475 B1* | 5/2017 | Yoshimizu | ............ | H10D 62/115 |
| 9,666,449 B2* | 5/2017 | Koval | ............ | H10B 41/35 |
| 9,666,525 B2* | 5/2017 | Kim | ............ | H01L 23/528 |
| 9,865,617 B2* | 1/2018 | Han | ............ | H10D 62/115 |
| 10,032,935 B2* | 7/2018 | Higuchi | ............ | H01L 29/7923 |
| 10,381,376 B1* | 8/2019 | Nishikawa | ............ | H01L 29/1037 |
| 10,438,962 B2* | 10/2019 | Kim | ............ | H10B 41/27 |
| 10,615,169 B2* | 4/2020 | van Schravendijk | ............ | |
| | | | | G11C 16/0408 |
| 10,672,785 B2* | 6/2020 | Simsek-Ege | ............ | H10D 64/035 |
| 10,700,078 B1* | 6/2020 | Cui | ............ | H10B 43/35 |
| 10,818,689 B2 | 10/2020 | Lee et al. | | |
| 10,825,831 B1* | 11/2020 | Koval | ............ | H10B 43/27 |
| 10,903,221 B2* | 1/2021 | Kim | ............ | H10B 43/35 |
| 11,018,151 B2* | 5/2021 | Kaneko | ............ | H01L 29/40117 |
| 11,152,386 B2* | 10/2021 | Or-Bach | ............ | H10B 41/27 |
| 11,217,602 B2* | 1/2022 | Bin | ............ | H10B 41/10 |
| 11,295,960 B1* | 4/2022 | Hattori | ............ | H01L 21/31116 |
| 11,302,716 B2* | 4/2022 | Makala | ............ | H10B 51/30 |
| 11,393,834 B2* | 7/2022 | Han | ............ | H01L 29/42324 |
| 11,393,839 B2* | 7/2022 | Bin | ............ | H10B 43/35 |
| 11,393,848 B2* | 7/2022 | Lee | ............ | H01L 21/764 |
| 11,398,496 B2* | 7/2022 | Kai | ............ | H01L 29/4234 |
| 11,417,534 B2* | 8/2022 | Xia | ............ | H01J 37/32724 |
| 11,444,094 B2* | 9/2022 | Park | ............ | H10B 43/27 |
| 11,495,618 B2* | 11/2022 | Lin | ............ | G11C 11/2255 |
| 11,532,640 B2* | 12/2022 | Chia | ............ | G11C 11/5657 |
| 11,569,262 B2* | 1/2023 | Yun | ............ | H01L 29/40117 |
| 11,587,823 B2* | 2/2023 | Chia | ............ | H10B 51/20 |
| 11,637,115 B2* | 4/2023 | Son | ............ | G11C 5/06 |
| | | | | 257/330 |
| 11,647,634 B2* | 5/2023 | Yang | ............ | H10D 30/0415 |
| | | | | 257/295 |
| 11,877,452 B2* | 1/2024 | Hinoue | ............ | H10B 43/50 |
| 2017/0018563 A1* | 1/2017 | Nishida | ............ | H01L 29/7926 |
| 2019/0312052 A1* | 10/2019 | Lee | ............ | H10B 43/10 |
| 2020/0144283 A1 | 5/2020 | Kim et al. | | |

FOREIGN PATENT DOCUMENTS

| | | |
|---|---|---|
| KR | 20190115936 A | 10/2019 |
| KR | 10-2019-0133539 A | 12/2019 |

OTHER PUBLICATIONS

Office Action (First Office Action) issued Apr. 25, 2025, by the State Intellectual Property Office of People's Republic of China in corresponding Chinese Patent Application No. 202111047348.2 and an English translation of the Office Action. (33 pages).

* cited by examiner

METHOD FOR FABRICATING SEMICONDUCTOR DEVICE AND APPARATUS FOR PROCESSING SUBSTRATE USING PLASMA

CROSS REFERENCE TO RELATED APPLICATIONS

This application claims the benefit of Korean Patent Application No. 10-2020-0116548, filed on Sep. 11, 2020, in the Korean Intellectual Property Office, the disclosure of which is incorporated herein by reference in its entirety.

FIELD OF THE INVENTION

The present invention relates to a method of fabricating a semiconductor device and a substrate processing apparatus using plasma.

DESCRIPTION OF THE RELATED ART

In order to meet the excellent performance and low price demanded by consumers, the degree of integration of semiconductor devices is increasing. Accordingly, three-dimensional semiconductor devices having a plurality of memory cells arranged in three dimensions (stereoscopic) are being developed. On the other hand, since the degree of integration is high, defects such as voids or seams may occur when metal is filled in a specific space. Such defects may deteriorate electrical characteristics and reliability of the semiconductor device.

SUMMARY OF THE INVENTION

The problem to be solved by the present invention is to provide a method of fabricating a semiconductor device with improved electrical characteristics and reliability.

Another problem to be solved by the present invention is to provide a substrate processing apparatus using plasma for implementing the method of fabricating the semiconductor device.

The subject of the present invention is not limited to the problems mentioned above, and other problems that are not mentioned will be clearly understood by those skilled in the art from the following description.

One aspect of the method for fabricating a semiconductor device of the present invention for achieving the above object comprises providing a substrate, in which a first oxide film, a nitride film, and a second oxide film are sequentially stacked, and a trench penetrating the first oxide film, the nitride film, and the second oxide film is formed, chamfering the oxide film exposed by the trench while removing a part of the nitride film exposed by the trench by using a first plasma process, and removing the nitride film left after the first plasma process by using a second plasma process.

Wherein the first plasma process may use a fluorine-containing radical.

Wherein the second plasma process may use a nitrogen-containing radical and an oxygen-containing radical.

Wherein a selection ratio of the nitride film to the oxide film may be a first selection ratio in the first plasma process, wherein a selection ratio of the nitride film to the oxide film may be a second selection ratio greater than the first selection ratio in the second plasma process.

Filling a space, from which the nitride film has been removed, with a metal may be further comprised.

Wherein the first plasma process and the second plasma process may be performed in-situ.

Another aspect of the method for fabricating a semiconductor device of the present invention for achieving the above object may comprise providing a substrate, in which an insulating film structure including a plurality of oxide films and a plurality of nitride films alternately stacked, a vertical structure penetrating the insulating film structure and including a charge storage film for storing data, and a trench penetrating the insulating film structure are formed, chamfering the plurality of oxide films exposed by the trench while removing a part of the plurality of nitride films exposed by the trench by using a first plasma process, removing a plurality of nitride films left after the first plasma process to form a gate formation region exposing a part of the vertical structure by using a second plasma process, and filling a metal in the gate formation region so as to be electrically connected to the vertical structure.

Wherein the first plasma process may use a fluorine-containing radical.

Wherein the second plasma process may use a nitrogen-containing radical and an oxygen-containing radical.

Wherein a selection ratio of the nitride film to the oxide film may be a first selection ratio in the first plasma process, wherein a selection ratio of the nitride film to the oxide film may be a second selection ratio greater than the first selection ratio in the second plasma process.

One aspect of the substrate processing apparatus of the present invention for achieving the above other object may comprise a first space disposed between an electrode and an ion blocker; a second space disposed between the ion blocker and a shower head; a processing space for processing a substrate under the shower head; and a support module disposed in the processing space and for supporting a substrate, wherein a substrate, in which a first oxide film, a nitride film, and a second oxide film are sequentially stacked and a trench penetrating the first oxide film, the nitride film, and the second oxide film is formed, is located on the support module, wherein a fluorine-containing gas is provided in the first space to generate a first plasma, wherein the first plasma is provided to the processing space through the ion blocker and the shower head so that a part of the plurality of nitride films exposed by the trench are removed while chamfering a plurality of exposed oxide films.

Wherein nitrogen and hydrogen-containing gas may be provided in the processing space, wherein the first plasma may be filtered by the ion blocker and provided to a processing space through the shower head, and mixed with the nitrogen and hydrogen-containing gas to generate a first etchant, wherein a part of the plurality of nitride films exposed by the trench may be removed while chamfering the plurality of exposed oxide films by the first etchant.

Wherein the nitrogen and hydrogen-containing gas may be provided through the ion blocker or the shower head.

Wherein after chamfering the plurality of oxide films, a nitrogen-containing gas and a first oxygen-containing gas may be provided in the first space to generate a second plasma, and a remaining part of the nitride film may be removed by the second plasma.

Wherein a second oxygen-containing gas may be provided in the processing space, wherein the second plasma may be filtered by the ion blocker and provided to the processing space through the shower head, and mixed with the second oxygen-containing gas to generate a second etchant, wherein a remaining part of the nitride film may be removed by the second etchant.

Wherein a temperature of the processing space may be 10 to 100° C., and a pressure of the processing space may be 650 to 850 mTorr.

Details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When elements are referred to as "on" or "above" of other elements, it includes not only when directly above of the other elements, but also other elements intervened in the middle. On the other hand, when elements are referred to as "directly on" or "directly above," it indicates that no other element is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the element in use or operation in addition to the direction shown in the figure. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Unless otherwise defined, all terms (including technical and scientific terms) used in the present description may be used with meanings that can be commonly understood by those of ordinary skill in the art to which the present invention belongs. In addition, terms defined in a commonly used dictionary are not interpreted ideally or excessively unless explicitly defined specifically.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

Figure 1:
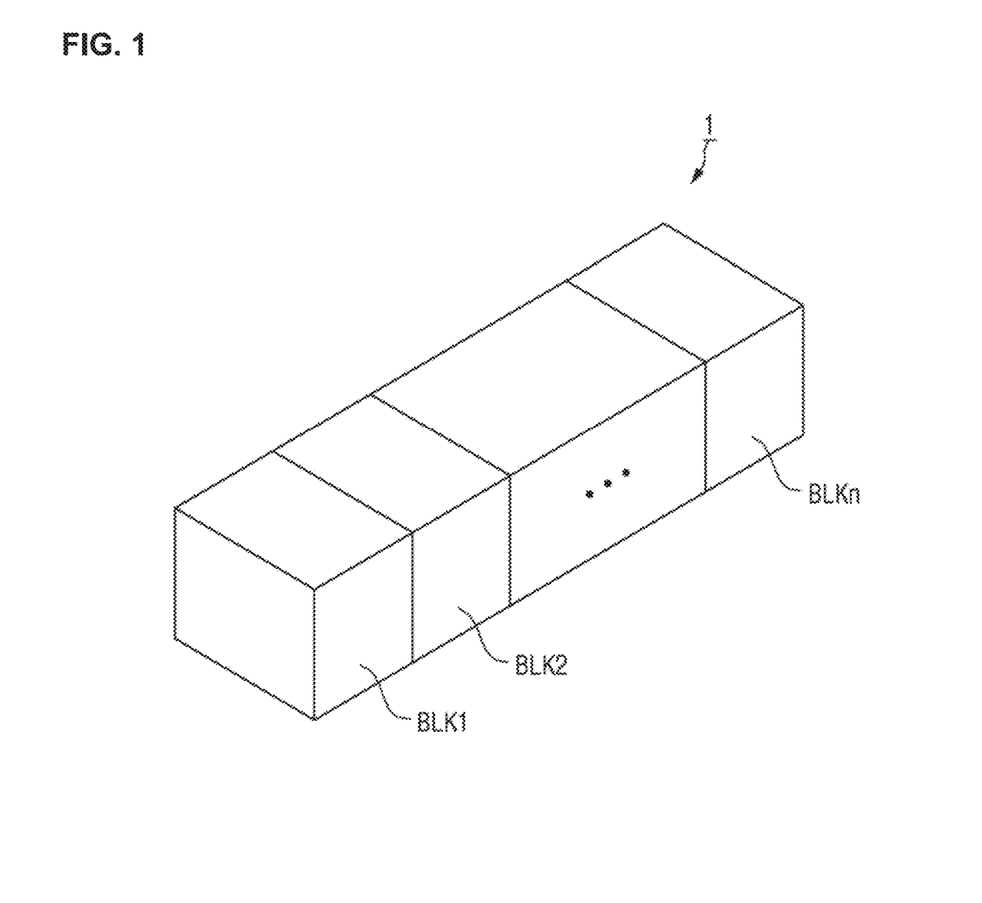
FIG. 1 is a block diagram illustrating a semiconductor device according to some embodiments of the present invention.
Figure 2:
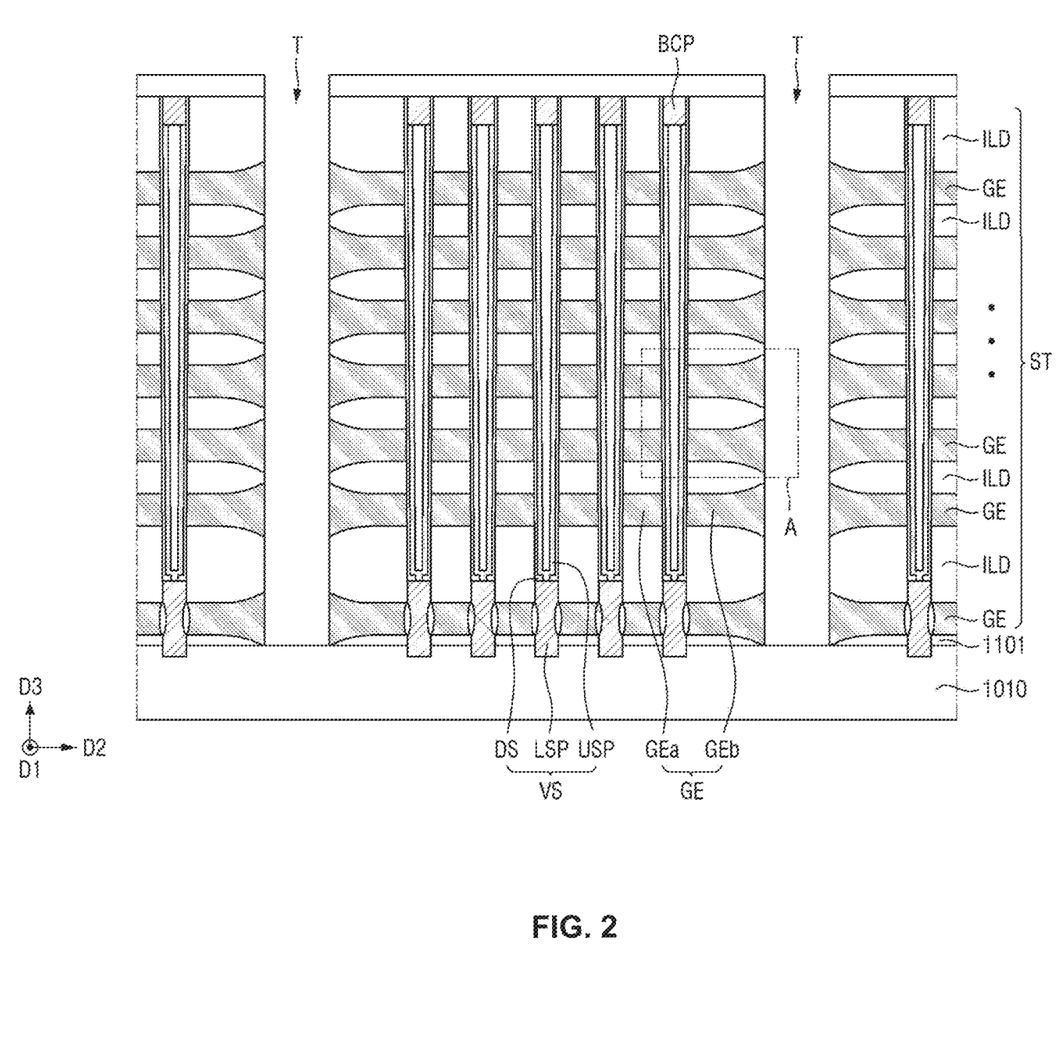
FIG. 2 is a diagram illustrating a part of a memory block of the semiconductor device of FIG. 1.
Figure 3:
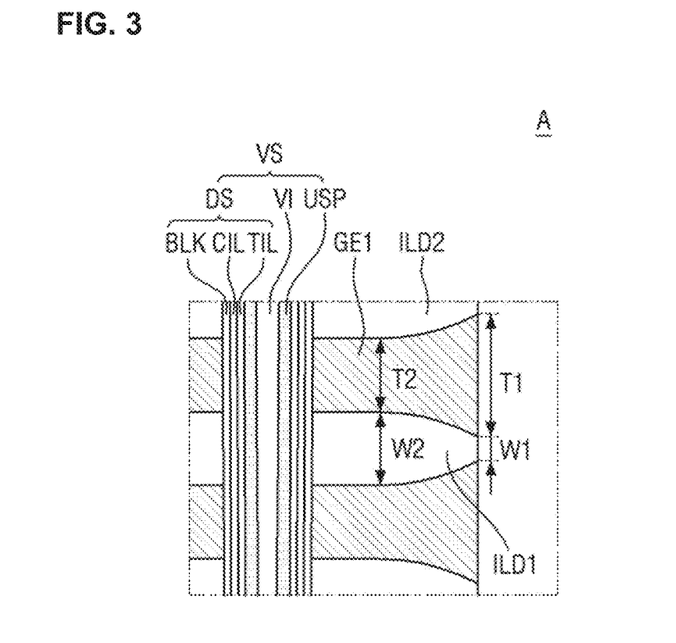
FIG. 3 is an enlarged view of area A of FIG. 2.

FIG. 1 is a block diagram illustrating a semiconductor device according to some embodiments of the present invention. FIG. 2 is a diagram illustrating a part of a memory block of the semiconductor device of FIG. 1. FIG. 3 is an enlarged view of area A of FIG. 2. The semiconductor device in FIGS. 1 to 3 is a vertical NAND flash device as an example, but is not limited thereto.

First, referring to FIG. 1, a memory cell array of a nonvolatile memory device 1 according to some embodiments of the present invention may include a plurality of memory blocks (BLK1 to BLKn, where n is a natural number).

Referring to FIG. 2, a plurality of electrode structures (ST) may be arranged on a substrate 1010. The electrode structures (ST) may extend in the first direction (D1) parallel to each other. Here, the first direction (D1) and the second direction (D2) may be parallel to the upper surface of the substrate 1010.

The substrate 1010 may be one of a material having semiconductor properties (e.g., a silicon wafer), an insulating material (e.g., glass), a semiconductor covered by an insulating material, or a conductor. For example, the substrate 1010 may be a silicon wafer. The buffer insulating film 1101 may be interposed between the electrode structures (ST) and the substrate 1010, and may include a silicon oxide film.

Each of the electrode structures (ST) may include a plurality of gate electrodes (GE) and a plurality of insulating films (ILD) alternately stacked along a third direction (D3) perpendicular to the first direction (D1) and the second direction (D2). The 3D semiconductor memory device may be a vertical NAND flash memory device, and the gate electrodes (GE) of each electrode structure (ST) may be used as the gate electrodes of string selection transistors of NAND cell strings, memory cell transistors, and ground selection transistors.

The thickness of the insulating films (ILD) may vary depending on the characteristics of the semiconductor memory device. The insulating films (ILD) may include, for example, a silicon oxide film or a low dielectric film.

The gate electrodes (GE) may include at least one selected from, for example, a metal (ex, tungsten, copper, aluminum, etc.), a doped semiconductor (ex, doped silicon, etc.), a conductive metal nitride (ex, titanium nitride, tantalum nitride, etc.) or transition metals (ex, titanium, tantalum, etc.).

A plurality of vertical structures (VS) may extend in a third direction (D3) perpendicular to the upper surface of the substrate 1010 and may penetrate each electrode structure (ST). The vertical structures (VS) may be arranged in zigzag along the first direction (D1) and the second direction (D2) from a plan view.

Each of the vertical structures (VS) may include a vertical semiconductor pattern (LSP, USP) connected to the substrate 1010 and a data storage pattern (that is, a charge storage film) (DS) interposed between the vertical semiconductor patterns (LSP, USP) and the electrode structure (ST). Furthermore, a bit line conductive pad (BCP) made of a conductive material may be provided on top of each of the vertical structures (VS). For example, the bit line conductive pad (BCP) may be made of a semiconductor material doped with impurities.

The vertical semiconductor patterns (LSP and USP) may include a semiconductor material such as silicon (Si), germanium (Ge), or a mixture thereof. The vertical semiconductor patterns (LSP and USP) may be used as ground in a vertical NAND flash memory device and channels of string selection transistors and memory cell transistors. Here, the vertical semiconductor patterns (LSP and USP) may include the lower semiconductor pattern (LSP) in contact with the substrate 1010 by penetrating the lower portion of the electrode structure (ST) and the upper semiconductor pattern (USP) in contact with the lower semiconductor pattern (LSP) by penetrating the upper portion of the electrode structure (ST). The lower semiconductor pattern (LSP) may be an epitaxial pattern and may have a pillar shape. The upper semiconductor pattern (USP) may have a U-shaped shape defining an empty space therein, a pipe shape with a lower end closed, or a macaroni shape, and the inside of the upper semiconductor pattern (USP) may be filled with a buried insulating pattern.

The data storage pattern (i.e., charge storage film) (DS) is a data storage film of a vertical NAND flash memory device, and may include a tunnel insulating film (TIL), a charge storage film (CIL), and a blocking insulating film (BLK) (see FIG. 3).

Here, referring to FIG. 3, a portion of the insulating film (ILD1) in contact with the trench (T) may have a first width W1, and a portion in contact with the vertical structure (VS) may have a second width W2. The first width W1 is smaller than the second width W2.

On the other hand, the gate electrode (GE1) is formed in a region (i.e., a gate formation region) between the adjacently stacked insulating films (ILD1 and ILD2). In the gate electrode (GE1) arranged between the lower insulating film (ILD1) and the upper insulating film (ILD2), a portion in contact with the trench (T) may have a first thickness T1, and a portion in contact with the vertical structure (VS) may have a second thickness T2. The first thickness T1 is thicker than the second thickness T2.

In other words, it can be seen that the entrance between the adjacently stacked insulating films (ILD1 and ILD2) is relatively wide (see T1). When forming the gate electrode (GE1) by filling the region (i.e., the gate formation region) between the insulating films (ILD1 and ILD2) adjacently stacked with a metal (for example, tungsten), since the entrance between the adjacently stacked insulating films (ILD1 and ILD2) is wide, it is possible to easily fill the region between the adjacently stacked insulating films (ILD1 and ILD2) with a metal. Accordingly, defects such as voids or seams are unlikely to occur in the gate electrode (GE1). It is possible to prevent the decrease in electrical characteristics and reliability caused by voids or seams.

Hereinafter, a method of manufacturing a semiconductor device according to some embodiments of the present invention will be described with reference to FIGS. 4 to 9. FIGS. 4 to 9 are diagrams of intermediate steps for describing a method of manufacturing a semiconductor device according to some embodiments of the present invention.

Figure 4:
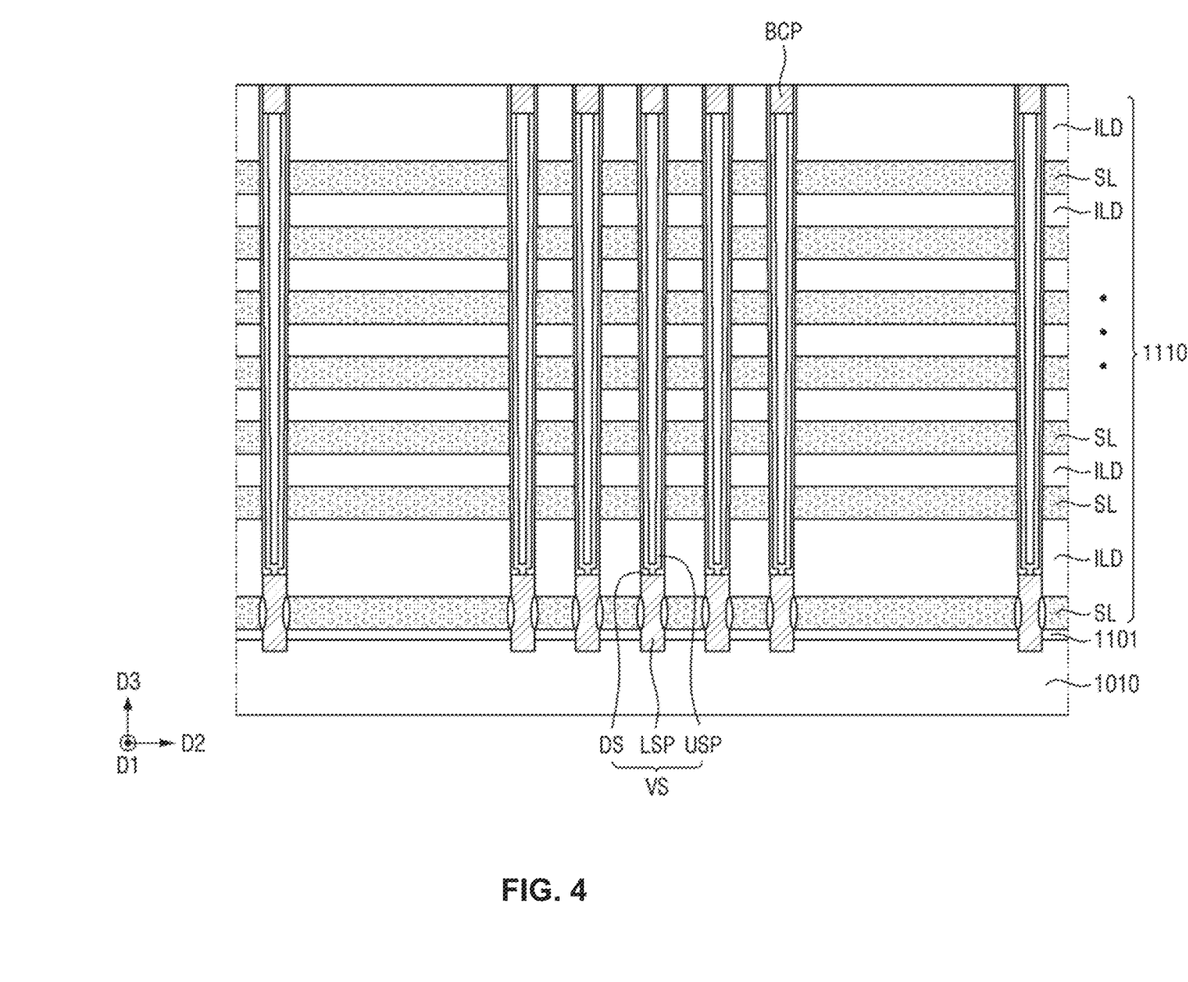
FIGS. 4 to 9 are diagrams of intermediate steps for describing a method of manufacturing a semiconductor device according to some embodiments of the present invention.

First, referring to FIG. 4, an insulating film structure 1110 may be formed by alternately depositing sacrificial films (SL) and insulating films (ILD) on a substrate 1010. In the insulating film structure 1110, the sacrificial films (SL) may be formed of a material capable of being etched with etch selectivity with respect to the insulating films (ILD). For example, the sacrificial films (SL) and the insulating films (ILD) are formed of an insulating material, and may have etch selectivity with each other. The sacrificial films (SL) and the insulating films (ILD) may be selected from a silicon film, a silicon oxide film, a silicon carbide, a silicon germanium, a silicon oxynitride film, or a silicon nitride film. For example, the sacrificial films (SL) may be formed of a silicon nitride film, and the insulating films (ILD) may be formed of a silicon oxide film. Before forming the insulating film structure 1110, a buffer insulating film 1101 made of a thermal oxide film may be formed on the upper surface of the substrate.

Subsequently, vertical structures (VS) that penetrate the insulating film structure 1110 and are connected to the substrate 1010 may be formed. Vertical holes that penetrate the insulating film structure 1110 and the buffer insulating film 1101 to expose the substrate 1010 are formed, and in each of the vertical holes, a lower semiconductor pattern (LSP), an upper semiconductor pattern (USP), and a data storage pattern (DS) are formed to make vertical structures (VS).

Specifically, the lower semiconductor pattern (LSP) may be an epitaxial pattern, which is formed by performing a selective epitaxial growth (SEG) process using the substrate 1010 exposed to the vertical holes as a seed layer. The lower semiconductor pattern (LSP) may be formed in a pillar shape filling lower portions of the vertical holes. As another example, forming the lower semiconductor pattern (LSP) may be omitted.

The upper semiconductor pattern (USP) may be formed in vertical holes, in which the lower semiconductor pattern (LSP) is formed. The upper semiconductor pattern (USP) may be formed by depositing a semiconductor layer in the vertical holes with a uniform thickness. Here, the semiconductor layer may be conformally formed with a thickness that does not completely fill the vertical holes. Accordingly, the upper semiconductor patterns (USP) may define an empty space (or gap region) in the vertical holes, and the empty space may be filled with the buried insulating pattern (VI) or air. Furthermore, a bit line conductive pad (BCP) may be formed on an upper end of the upper semiconductor pattern (USP). The bit line conductive pad (BCP) may be an impurity region doped with impurities or may be formed of a conductive material.

Figure 5:
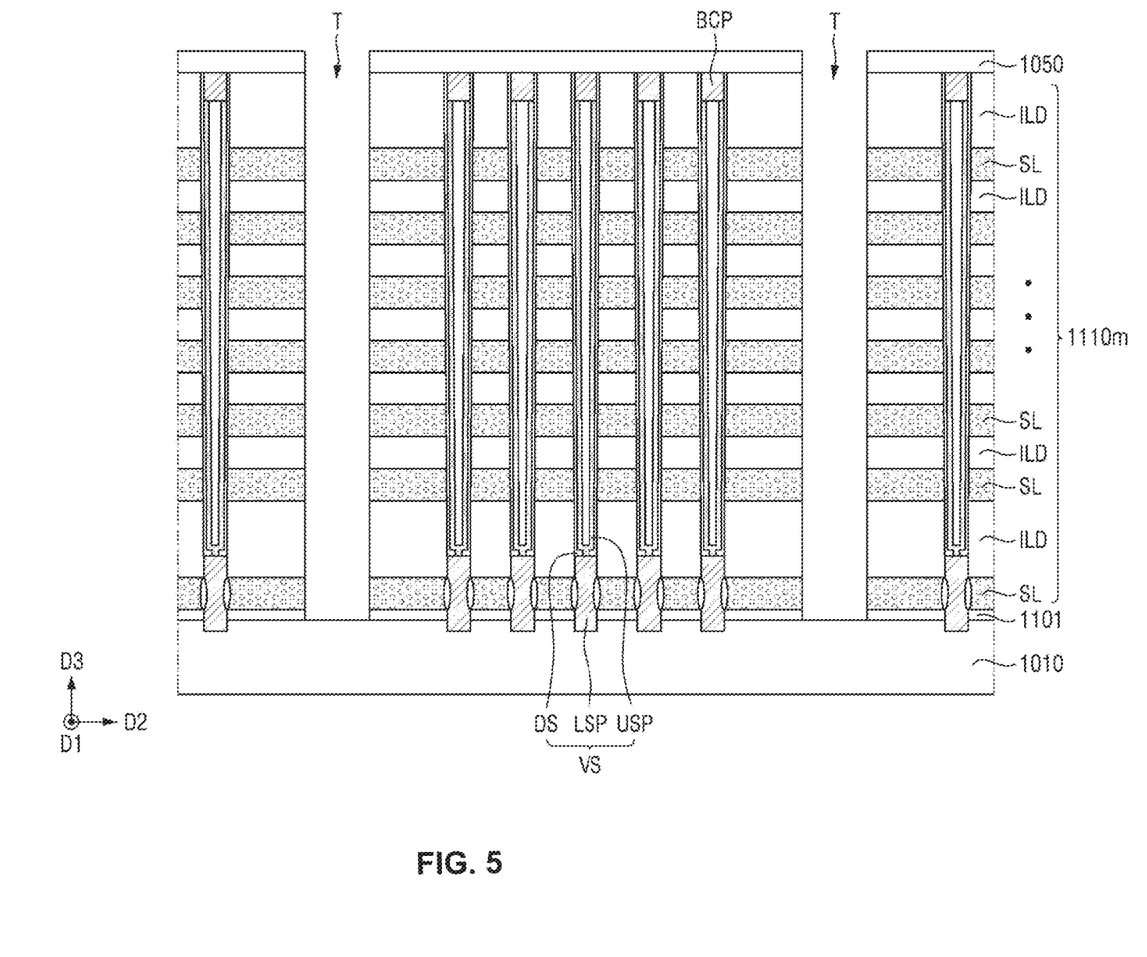

Referring to FIG. 5, a first interlayer insulating film 1050 may be formed to cover upper surfaces of the vertical structures (VS). After the first interlayer insulating film 1050 is formed, trenches (T) that penetrate the first interlayer insulating film 1050 and the insulating film structure 1110 to expose the substrate 1010 may be formed. The trenches (T) may be formed to be spaced apart from the vertical structures (VS) to expose sidewalls of the sacrificial films (SL) and the insulating films (ILD). The trenches (T) may be formed by performing an anisotropic etching process on the insulating film structure 1110, and during the anisotropic etching process, the insulating films (ILD) and the sacrificial films (SL) may have a low etch selection ratio.

As the trenches (T) are formed, a plurality of mold structures 1110m may be formed on the substrate 1010. A part of the substrate 1010 between the mold structures 1110m may be exposed by the trench (T), and a plurality of vertical structures (VS) may penetrate each of the mold structures 1110m.

Figure 6:
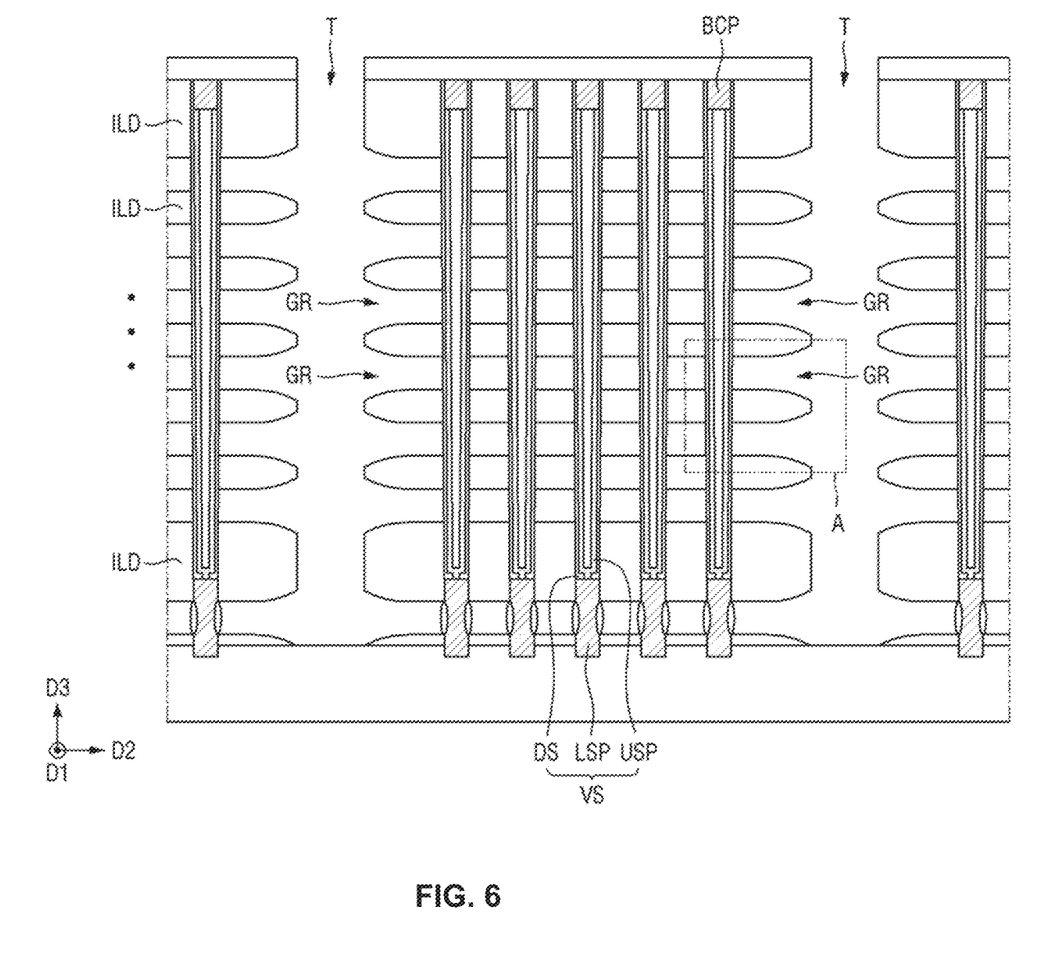

Referring to FIG. 6, by removing the sacrificial films (SL) exposed to the trenches (T), gate formation regions (GR) may be formed between the insulating films (ILD). The gate formation regions (GR) may be formed by isotropically etching the sacrificial films (SL) using an etching recipe having etch selectivity for the insulating films (ILD), the vertical structures (VS), and the substrate 1010. Here, the sacrificial films (SL) may be completely removed by an isotropic etching process.

Hereinafter, a process of removing the sacrificial films (SL) will be described in detail. A case where the sacrificial films (SL) are nitride films (e.g., silicon nitride films) and the insulating films (ILD) are oxide films (e.g., a silicon oxide films) will be described.

The process of removing the sacrificial films (SL) may be performed by a plurality of (e.g., two) different plasma processes.

Figure 7:
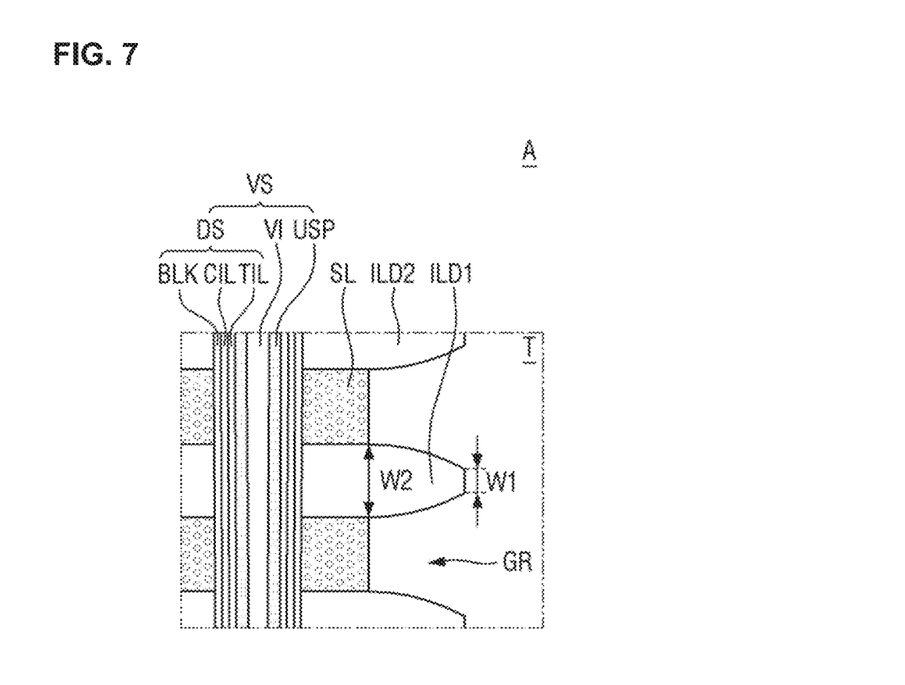

Specifically, by the first plasma process, the insulating films (ILD1, ILD2) exposed by the trench (T) (oxide films) are chamfered while removing a part of the sacrificial films (SL) (nitride films) exposed by the trench, as shown in FIG. 7. That is, the thickness of the insulating films (ILD1 and ILD2) may be decreased in the outer portion in contact with the trench (T) compared to the inner portion in contact with the vertical structures (VS) (W2>W1).

Figure 8:
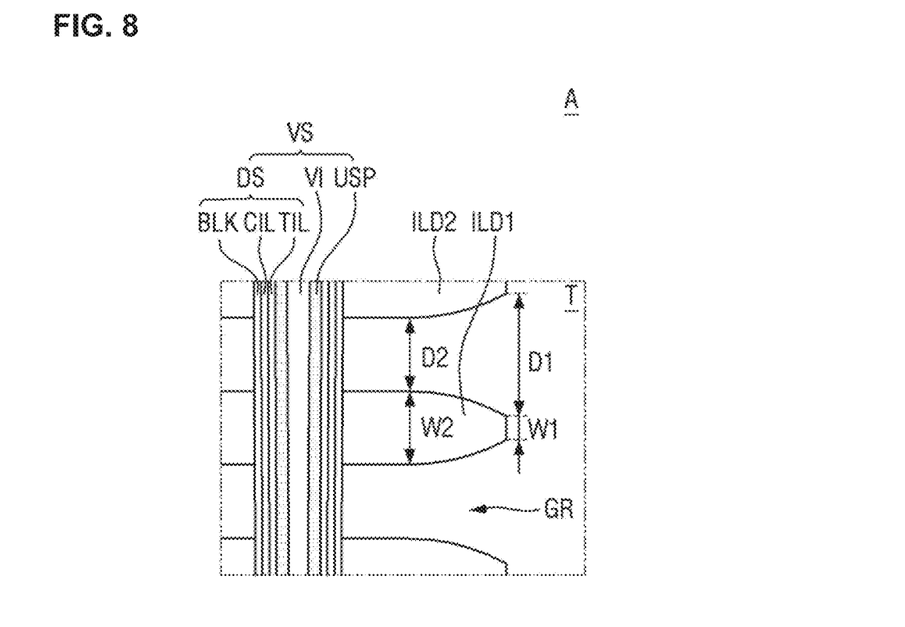

Subsequently, by the second plasma process, as shown in FIG. 8, the sacrificial films (SL) (nitride films) left after the first plasma process are removed. As a result, the gate formation region (GR) is formed. That is, the width of the gate formation region (GR) may be larger in the outer portion in contact with the trench (T) than in the inner portion in contact with the vertical structures (VS) (D1>D2).

In the first plasma process and the second plasma process, the selection ratio of the nitride film (i.e., the sacrificial films SL) with respect to the oxide film (i.e., the insulating films ILD1 and ILD2) may be controlled differently. This means that the higher the selection ratio, the higher the etching amount of the nitride film compared to the etching amount of the oxide film.

In the first plasma process, the selection ratio of the nitride film to the oxide film may be a first selection ratio, and in the second plasma process, the selection ratio of the nitride film to the oxide film may be a second selection ratio greater than the first selection ratio. That is, since the first plasma process has a low selection ratio, the oxide film is removed together with the nitride film, so that the edge of the oxide film may be rounded (that is, it may be chamfered). On the other hand, since the second plasma process has a high selection ratio, the nitride film is mainly removed.

Since the HF source is required in the first plasma process, a fluorine-containing radical (F*) is used in the first plasma process. As a gas for generating the first plasma, $NF_3$ gas (in addition, $H_2$ gas) may be used.

Further, since a NO source is required in the second plasma process, a nitrogen-containing radical (N*) and an oxygen-containing radical (O*) are used in the second plasma process. As a gas for generating the second plasma, $N_2$ or $O_2$ gases may be used.

Meanwhile, the first plasma process and the second plasma process may be performed in-situ. That is, the first plasma process and the second plasma process may be continuously performed in one chamber.

Figure 9:
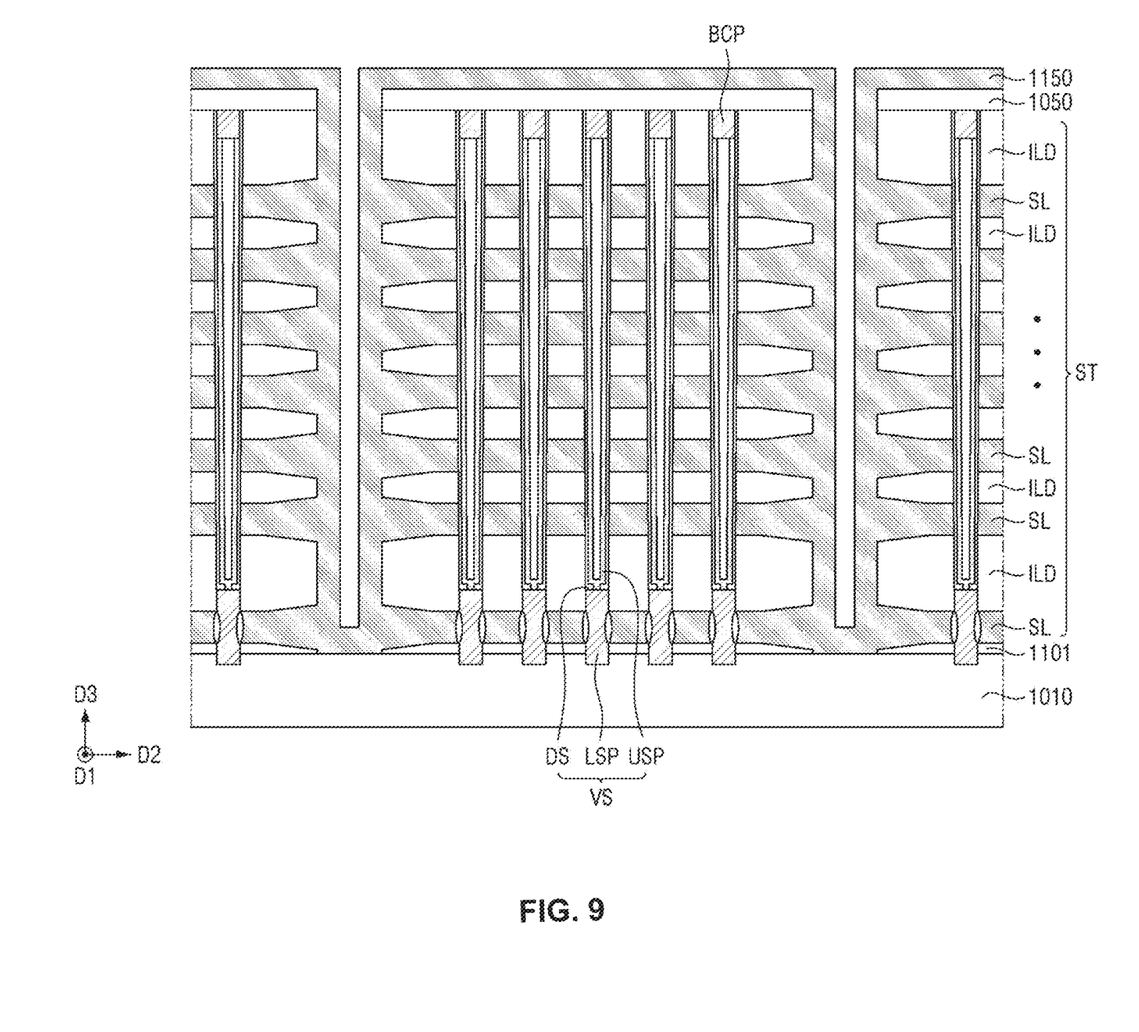

Referring to FIG. 9, a substrate processing apparatus capable of performing a first plasma process and a second plasma process will be described in detail.

Next, referring to FIG. 9, a horizontal insulating film (not shown) and a gate conductive film 1150 may be sequentially formed in the gate formation regions (GR). The horizontal insulating film may be formed to have a substantially uniform thickness on the surface of the mold structure 1110m, in which the gate formation regions (GR) are formed. The gate conductive film 1150 may partially fill the trenches (T) or may completely fill the trenches (T).

The gate conductive film 1150 may be deposited by supplying a deposition gas from the trenches (T) to the gate formation regions (GR). Since the distance between the insulating films (ILD) increases as they are closer to the trenches (T) (that is, see D2<D1 in FIG. 8), generation of a void and seam can be suppressed while filling the gate formation regions (GR) with the gate conductive film 1150.

For example, forming the gate conductive film 1150 may include sequentially depositing a barrier metal film and a metal film. The barrier metal film may be formed of, for example, a metal nitride film such as TiN, TaN, or WN. In addition, the metal film may be made of, for example, a metal material such as W, Al, Ti, Ta, Co, or Cu. For example, the gate conductive film 1150 may be formed using a chemical vapor deposition (CVD) method using tungsten hexafluoride ($WF_6$) and silane ($SiH_4$) or hydrogen ($H_2$) gas.

Referring back to FIG. 2, the gate conductive films 1150 connected to each other are separated to generate gate electrodes (GE) separated for each cell.

Figure 10:
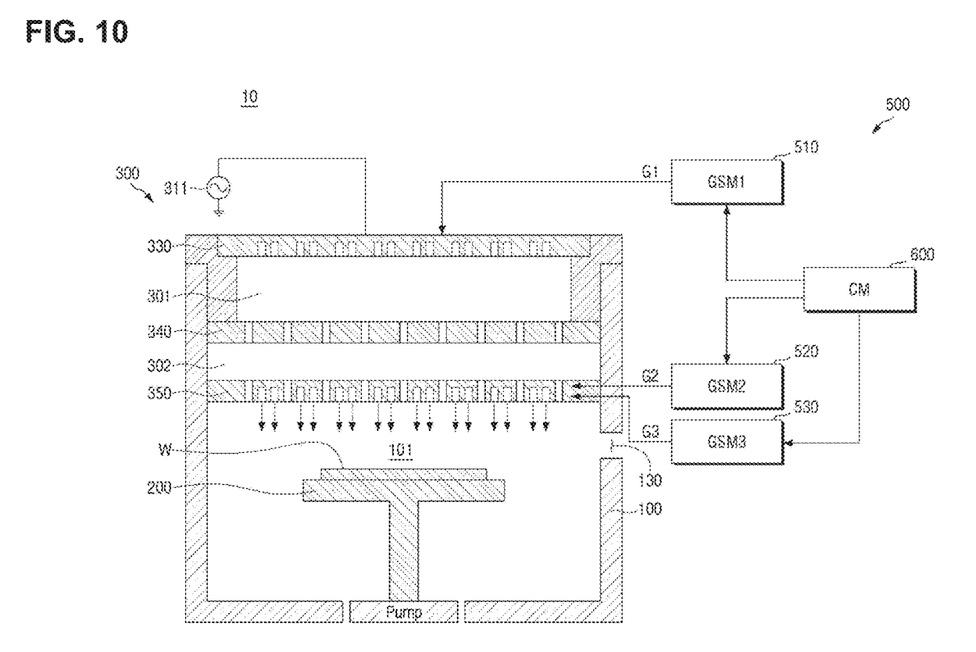
FIG. 10 is a conceptual diagram illustrating a substrate processing apparatus according to some embodiments of the present invention.

FIG. 10 is a conceptual diagram illustrating a substrate processing apparatus according to some embodiments of the present invention. FIG. 10 may be a substrate processing apparatus for performing the first plasma process of FIG. 7 and/or the second plasma process of FIG. 8.

Referring to FIG. 10, the substrate processing apparatus 10 according to some embodiments of the present invention includes a process chamber 100, a support module 200, an electrode module 300, a gas supply module 500, and a control module 600, etc.

The process chamber 100 provides a processing space 101, in which the substrate (W) is processed, therein. The process chamber 100 may have a circular cylindrical shape. The process chamber 100 is made of a metal material. For example, the process chamber 100 may be made of aluminum. An opening 130 is formed in one side wall of the process chamber 100. The opening 130 is used as an entrance through which the substrate (W) can be carried in or out. The entrance can be opened and closed by a door. An exhaust port (not shown) is installed on the bottom surface of the process chamber 100. The exhaust port functions as an outlet 150 through which by-products generated in the processing space 101 are discharged to the outside of the process chamber 100. The exhaust operation is performed by the pump.

The support module 200 is installed in the processing space 102 and supports the substrate (W). The support module 200 may be an electrostatic chuck that supports the substrate (W) using electrostatic force, but is not limited thereto. The electrostatic chuck may include a dielectric plate, in which a substrate (W) is placed on an upper surface, an electrode that is installed in the dielectric plate and provides electrostatic force so that the substrate (W) is adsorbed to the dielectric plate, and a heater, which is installed in the dielectric plate and heats the substrate (W) to control temperature of the substrate (W).

The electrode module 300 includes an electrode (or upper electrode) 330, an ion blocker 340, a shower head 350, and the like, and serves as a capacitively coupled plasma source. The gas supply module 500 includes a first gas supply module 510, a second gas supply module 520, and a third gas supply module 530. The control module 600 controls gas supply of the gas supply modules 510, 520, and 530.

A first space 301 is disposed between the electrode 330 and the ion blocker 340, and a second space 302 is disposed between the ion blocker 340 and the shower head 350. A processing space 101 is located under the shower head 350.

The electrode 330 may be connected to a high frequency power supply 311, and the ion blocker 340 may be connected to a constant voltage (e.g., a ground voltage). The electrode 330 includes a plurality of first supply holes. The first gas supply module 510 provides the first gas (G1) to the first space 301 through the electrode 330 (i.e., the first supply hole of the electrode 330). The electromagnetic field generated between the electrode 330 and the ion blocker 340 excites the first gas (G1) in a plasma state. The first gas excited in a plasma state (i.e., plasma effluent) contains radicals, ions and/or electrons.

The ion blocker 340 is formed of a conductive material, and may have, for example, a plate shape such as a disk. The ion blocker 340 may be connected with a constant voltage. The ion blocker 340 includes a plurality of first through holes formed in the vertical direction. In the plasma effluent, radicals or uncharged neutral species may pass through the first through hole of the ion blocker 340. On the other hand, charged species (i.e., ions) are difficult to pass through the first through hole of the ion blocker 340.

The shower head 350 is formed of a conductive material, and may have a plate shape such as a disc. The shower head 350 may be connected with a constant voltage. The shower head 350 includes a plurality of second through holes formed in the vertical direction. The plasma effluent passing through the ion blocker 340 is provided to the processing space 101 through the second space 302 and the second through hole of the shower head 350.

Further, a separate process gas (i.e., a second gas (G2), a third gas (G3)) is provided to the ion blocker 340 and/or the shower head 350, and the process gas reacts/mixes with the plasma effluent to form an etchant.

When the process gas is provided through the ion blocker 340, the process gas is provided to the process space 101 through the second space 302 and the shower head 350. Alternatively, as shown in FIG. 10, the process gas may be provided to the processing space 101 through the shower head 350.

When performing the above-described first plasma process, the first gas (G1) provided to the first space 301 through the electrode 330 may be a fluorine-containing gas (for example, $NF_3$ gas) since an HF source is required. As the first gas (G1), $H_2$ gas may be additionally included in addition to the $NF_3$ gas. Also, the second gas (G2) may be $NH_3$ gas.

Further, as the third gas (G3), a nitrogen-containing gas (e.g., $N_2$ gas) may be added. Nitrogen gas ($N_2$) plays a role of adjusting the uniformity of etching. When the flow rate of the nitrogen gas is increased, the etch rate decreases and the uniformity increases. Conversely, when the flow rate of the nitrogen gas is decreased, the etch rate increases and the uniformity decreases. By controlling the flow rate of the nitrogen gas independently from the flow rate of the ammonia gas, the uniformity can be precisely controlled.

In addition, since an NO source is required in the second plasma process, the first gas (G1) provided to the first space 301 through the electrode 330 may be $N_2$ or $O_2$ gas. The second gas (G2) may be $O_2$ gas. In the second plasma process as well, a gas capable of adjusting the etching uniformity may be used as the third gas (G3).

Next, the first plasma process and the second plasma process will be described in detail.

A fluorine-containing gas (i.e., $NF_3$) is provided in the first space 301 to generate a first plasma. A nitrogen and hydrogen-containing gas (i.e., $NH_3$) is provided in the processing space 101.

The first plasma is provided to the processing space 101 through the ion blocker 340 and the shower head 350. That is, the first plasma is filtered by the ion blocker 340 and provided to the processing space 101 through the shower head 350, and is mixed with nitrogen and hydrogen-containing gas (i.e., $NH_3$) to generate the first etchant. By the first etchant, a plurality of exposed oxide films (see ILD1 and ILD2 in FIG. 7) are chamfered, and a part of the plurality of nitride films (see SL in FIG. 7) exposed by the trench (T) is also removed.

The first plasma environment may be exhausted, and the second plasma process may be performed in situ. The second plasma process may be performed in the same chamber as the chamber in which the first plasma process was performed.

A nitrogen-containing gas (i.e., $N_2$) and a first oxygen-containing gas (i.e., $O_2$) are provided in the first space 301 to generate a second plasma. A second oxygen-containing gas (i.e., $O_2$) may be provided in the processing space 101.

The second plasma is filtered by the ion blocker 340 and provided to the processing space 101 through the shower head 350, and is mixed with a second oxygen-containing gas (i.e., $O_2$) to generate a second etchant. By the second etchant, a remaining portion of the nitride film is removed (see FIG. 8).

During the first plasma process and the second plasma process, the temperature of the processing space 101 may be 10 to 100° C., and the pressure may be 650 to 850 mTorr. In the first plasma process, $NF_3$ gas and $H_2$ gas for generating plasma may be provided in a range of 10 to 40 sccm and 0 to 20 sccm, respectively. In the second plasma process, the $N_2$ gas and the $O_2$ gas for generating plasma may be provided in a range of 100 to 1000 sccm and 100 to 2000 sccm, respectively.

Figure 11:
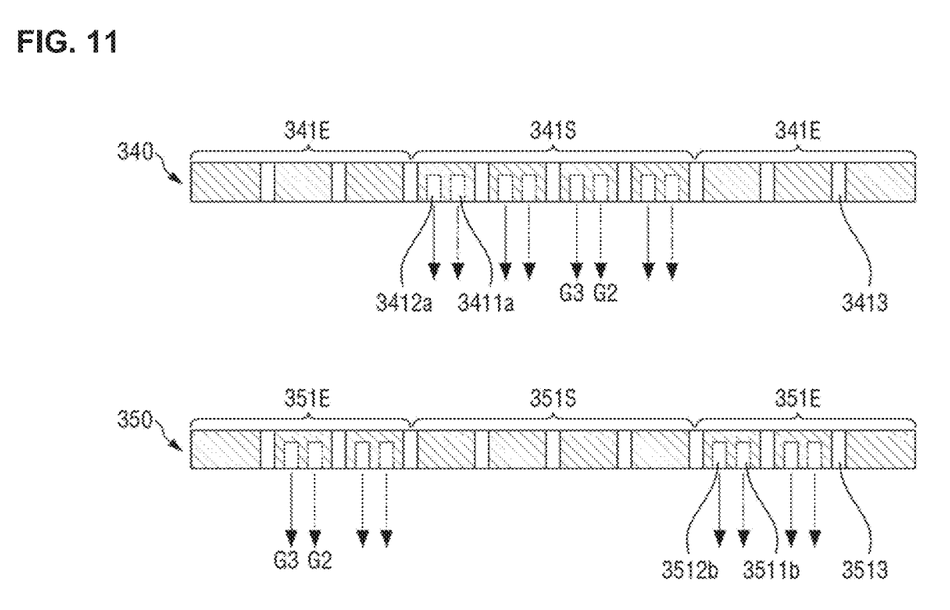
FIG. 11 is another example of an ion blocker and a shower head of the substrate processing apparatus of FIG. 10.
Figure 12:
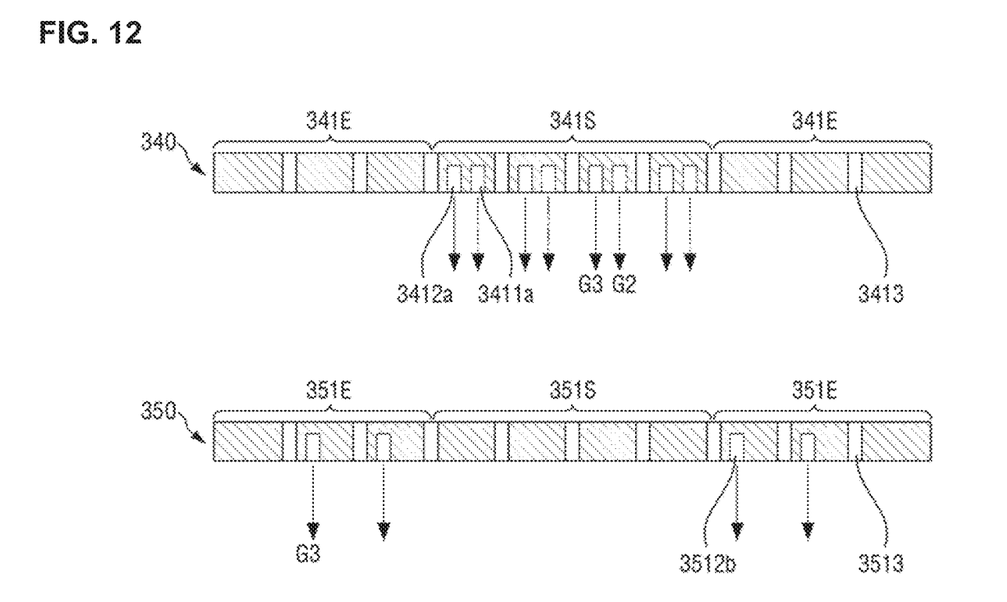
FIG. 12 is another example of an ion blocker and a shower head of the substrate processing apparatus of FIG. 10.

FIG. 11 is another example of an ion blocker and a shower head of the substrate processing apparatus of FIG. 10. FIG. 12 is another example of an ion blocker and a shower head of the substrate processing apparatus of FIG. 10.

The second gas (G2) and the third gas (G3) may be provided only in some areas of the ion blocker 340 and the shower head 350.

Specifically, referring to FIG. 11, the ion blocker 340 includes a first filter region 341S and a second filter region 341E disposed outside the first filter region 341S. The first filter region 341S may be disposed in a central region of the ion blocker 340, and the second filter region 341E may be disposed in an edge region of the ion blocker 340.

The shower head 350 includes a first shower region 351S and a second shower region 351E disposed outside the first shower region 351S. The first shower region 351S may be disposed in a central region of the shower head 350, and the second shower region 351E may be disposed in an edge region of the shower head 350.

In particular, the supply holes 3411a and 3412a may be formed in the first filter region 341S of the ion blocker 340, and the supply hole may not be formed in the second filter region 341E. On the other hand, a supply hole is not formed in the first shower region 351S of the shower head 350, and supply holes 3511b and 3512b are formed in the second shower region 351E. A through hole 3513 is formed in the front of the shower head 350.

In this structure, the second gas (G2) and the third gas (G3) may be supplied through the first filter region 341S and the second shower region 351E. The second gas (G2) is supplied through the supply hole 3411a of the first filter region 341S and through the supply hole 3511b of the second shower region 351E. The third gas (G3) is supplied through the supply hole 3412a of the first filter region 341S and through the third supply hole 3512b of the second shower region 351E. The second gas (G2) and the third gas (G3) supplied through the first filter region 341S are provided to the processing space 101 through the through hole 3513.

Meanwhile, the flow rate of the third gas (G3) supplied through the first filter region 341S and the flow rate of the third gas (G3) supplied through the second shower region 351E may be controlled differently.

When the flow rate of the third gas (G3) supplied through the first filter region 341S is greater than the flow rate of the third gas (G3) supplied through the second shower region 351E, the third gas G3 increases on the central region of the substrate (W) corresponding to the first filter region 341S. Accordingly, the etch rate in the central region of the substrate (W) decreases and the uniformity increases.

On the other hand, when the flow rate of the third gas (G3) supplied through the second shower region 351E is greater than the flow rate of the third gas (G3) supplied through the first filter region 341S, the third gas (G3) increases on the edge region of the substrate (W) corresponding to the second shower region 351E. Accordingly, the etch rate in the edge region of the substrate (W) decreases and the uniformity increases.

Referring to FIG. 12, in a structure similar to that of FIG. 11, the second gas (G2) may be supplied only in the first filter region 341S, and the third gas (G3) may be supplied through the first filter region 341S and the second shower region 351E.

The second gas G2 is supplied through the supply hole 3411a of the first filter region 341S. The third gas G3 is supplied through the supply hole 3412a of the first filter region 341S and through the third supply hole 3512b of the second shower region 351E. The second gas (G2) supplied through the first filter region 341S is provided to the processing space 101 through the through hole 3513. In this case, the third gas (G3) is relatively larger than the second gas (G2) on the edge region of the substrate (W). Accordingly, the etch rate in the edge region of the substrate (W) decreases and the uniformity increases.

Meanwhile, although not described in a separate drawing, the second gas (G2) may be supplied from the first filter region 341S and the second shower region 351E, and the third gas (G3) may be supplied through the first filter region 341S.

Although the embodiments of the present invention have been described with reference to the above and the accompanying drawings, those of ordinary skill in the art to which the present invention pertains can understand that the present invention can be implemented in other specific forms without changing the technical spirit or essential features of the present invention. Therefore, it should be understood that the embodiments described above are illustrative and non-limiting in all respects.

What is claimed is:

1. A method for fabricating a semiconductor device comprising:
    providing a substrate, in which a first oxide film, a nitride film, and a second oxide film are sequentially stacked, the substrate further comprising a trench penetrating the first oxide film, the nitride film, and the second oxide film in a thickness direction perpendicular to an upper surface of the substrate;
    chamfering the first and second oxide films exposed by the trench to reduce the thickness of ends of the first and second oxide films while removing a part of the nitride film exposed by the trench by using a first plasma process, wherein the first plasma process uses a fluorine-containing radical; and
    removing a portion of the nitride film left after the first plasma process by using a second plasma process,
    wherein a selection ratio of the nitride film to the first and second oxide films is a first selection ratio in the first plasma process,
    wherein a selection ratio of the nitride film to the first and second oxide films is a second selection ratio greater than the first selection ratio in the second plasma process.

2. The method of claim 1, wherein the second plasma process uses first and second radicals, the first radical being a nitrogen-containing radical and the second radical being an oxygen-containing radical.

3. The method of claim 1, further comprising filling a space, from which the nitride film has been removed, with a metal.

4. The method of claim 1, wherein the first plasma process and the second plasma process are performed in-situ.

5. The method of claim 1, wherein the chamfering is performed after formation of the trench penetrating the first oxide film, the nitride film, and the second oxide film in the thickness direction.

* * * * *